(12) United States Patent
Huh (10) Patent No.: US 8,559,233 B2
(45) Date of Patent: Oct. 15, 2013

(54) SEMICONDUCTOR MEMORY DEVICE (75) Inventor: Hwang Huh, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 167 days.

(21) Appl. No.: 13/178,584

(22) Filed: Jul. 8, 2011

(65) Prior Publication Data
US 2012/0008418 A1 Jan. 12, 2012

(30) Foreign Application Priority Data

Jul. 9, 2010 (KR) .......................... 10-2010-0066610

(51) Int. Cl.
*G11C 16/06* (2006.01)
*G11C 16/04* (2006.01)
*G11C 7/00* (2006.01)

(52) U.S. Cl.
USPC ............ 365/185.25; 365/185.17; 365/185.21; 365/189.14

(58) Field of Classification Search
USPC .................................................. 365/185.25
See application file for complete search history.

(56) References Cited

U.S. PATENT DOCUMENTS

| | | | | |
|---|---|---|---|---|
| 5,768,188 A * | 6/1998 | Park et al. | ................. | 365/185.03 |
| 6,996,014 B2 * | 2/2006 | Lee et al. | ................. | 365/189.05 |
| 7,046,554 B2 * | 5/2006 | Lee | ........................... | 365/185.18 |
| 7,187,584 B2 * | 3/2007 | Chang | ...................... | 365/185.17 |
| 7,336,543 B2 * | 2/2008 | Chen et al. | ............... | 365/189.05 |
| 7,372,767 B2 * | 5/2008 | Kim | ......................... | 365/230.06 |
| 7,567,456 B2 * | 7/2009 | Zanardi et al. | ........... | 365/185.05 |
| 7,813,186 B2 * | 10/2010 | Park et al. | ................ | 365/189.02 |
| 7,898,872 B2 * | 3/2011 | Han | ......................... | 365/185.25 |
| 8,125,828 B2 * | 2/2012 | Seong et al. | ............. | 365/185.12 |
| 8,274,825 B2 * | 9/2012 | Pyeon | ...................... | 365/185.03 |
| 8,335,107 B2 * | 12/2012 | Lee | ......................... | 365/185.11 |
| 2003/0076719 A1 * | 4/2003 | Byeon et al. | .................. | 365/200 |
| 2003/0210576 A1 * | 11/2003 | Hwang et al. | ............ | 365/189.05 |
| 2006/0181924 A1 * | 8/2006 | Cha | .......................... | 365/185.12 |
| 2010/0329036 A1 * | 12/2010 | Park | ........................ | 365/185.25 |

FOREIGN PATENT DOCUMENTS

KR 100630535 9/2006

OTHER PUBLICATIONS

Notice of Preliminary Rejection issued from Korean Intellectual Property Office on Aug. 11, 2011.

* cited by examiner

*Primary Examiner* — Son Mai
(74) *Attorney, Agent, or Firm* — IP & T Group LLP (57) ABSTRACT

A semiconductor memory device includes even page buffers coupled to even memory cells through respective even bit lines, odd page buffers coupled to odd memory cells through respective odd bit lines, first BL selectors, each configured to couple each of the even bit lines to the respective even page buffers and to couple each of the even page buffers to respective odd bit lines so that the even and odd page buffers precharge the odd bit lines in a precharge operation for the odd bit lines, and second BL selectors, each configured to couple each of the odd bit lines to the respective odd page buffers and to couple each of the odd page buffers to respective even bit lines so that the even and odd page buffers precharge the even bit lines in a precharge operation for the even bit lines.

11 Claims, 7 Drawing Sheets

SEMICONDUCTOR MEMORY DEVICE

CROSS-REFERENCE TO RELATED APPLICATION

Priority to Korean patent application number 10-2010-0066610 filed on Jul. 9, 2010, the entire disclosure of which is incorporated by reference herein, is claimed.

BACKGROUND

Exemplary embodiments relate to a semiconductor memory device and, more particularly, to a semiconductor memory device performing a recharge operation.

With the recent development of multipolar (X2 and X3) schemes in the semiconductor memory field, the number of verification operations increase according to a geometric progression during a write operation. In order to improve the writing performance of the write operation, the number of verification operations needs to be reduced, the page size of the unit page needs to be increased, or the time that it takes to perform each verification operation needs to be reduced.

BRIEF SUMMARY

Exemplary embodiments relate to a semiconductor memory device which is capable of reducing the time taken to precharge bit lines by precharging an even bit line and an odd bit line at the same time.

An exemplary semiconductor memory device according to an aspect of the present disclosure includes a memory cell array configured to include even cell strings coupled to respective even bit lines and odd cell strings coupled to respective odd bit lines, even page buffers coupled to the even memory cells of the memory cell array through the respective even bit lines, odd page buffers coupled to the odd memory cells thereof through the respective odd bit lines, first BL selectors, each configured to couple each of the even bit lines to the respective even page buffers in order to store data in the even memory cells or read data stored in the even memory cells, and to couple each of the even page buffers to respective odd bit lines so that the even and odd page buffers precharge the odd bit lines in a precharge operation for the odd bit lines, and second BL selectors, each configured to couple each of the odd bit lines to the respective odd page buffers in order to store data in the odd memory cells or read data stored in the odd memory cells, and to couple each of the odd page buffers to respective even bit lines so that the even and odd page buffers precharge the even bit lines in a precharge operation for the even bit lines.

An exemplary semiconductor memory device according to another aspect of the present disclosure includes a first cell string, having first memory cells, coupled to a first bit line, a second cell string, having second memory cells, coupled to a second bit line, a first page buffer comprising a register and a sense node precharge unit, and a first BL selector configured to couple the first bit line to the first page buffer during a precharge operation of the first bit line, and to discharge the first bit line during a precharge operation of the second bit line.

An exemplary operating method of a semiconductor memory device comprising even page buffers configured to perform a read operation of even memory cells coupled to even bit line and odd page buffers configured to perform a read operation of odd memory cells coupled to odd bit line according to an aspect of the present disclosure includes connecting the odd page buffer with the even bit line when the read operation to the even memory cells is performed, precharging the even bit line through the even page buffer and the odd page buffer, sensing a voltage level of the even bit line through the even page buffer.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

In a first exemplary embodiment of this disclosure, the writing performance can be improved by using an all bit line architecture scheme (hereinafter referred to as an 'ABL' scheme).

In a known even odd bit line architecture scheme (hereinafter referred to as an 'EOBL' scheme), memory cells included in a cell string coupled to an even bit line are programmed by supplying one program voltage, and memory cells included in a cell string coupled to an odd bit line are programmed by supplying an additional program voltage.

As compared with the EOBL scheme, in the ABL scheme, memory cells can be programmed at the same time by supplying one program voltage to an even cell string coupled to an even bit line and an odd cell string coupled to an odd bit line. Accordingly, the page size can be doubled and interference and disturbance can be reduced using the ABL scheme, as compared with the existing EOBL scheme.

In the ABL scheme, in the case where a voltage sensing scheme is used in a verification operation, the verification operation is performed for each of the even cell string and the odd cell string in order to increase the accuracy of the verification operation. If the voltage sensing scheme is used, however, the writing performance may be reduced because the verification time is increased.

In a second exemplary embodiment of this disclosure, the time taken to perform each verification operation can be reduced by reducing the time taken to precharge bit lines by using the ABL scheme employing the voltage sensing scheme. If this scheme is used, the writing performance of the ABL scheme employing the voltage sensing scheme can be increased because each verification time is reduced.

In the ABL scheme employing the voltage sensing scheme according to the first exemplary embodiment of this disclosure, during the verification operation of an even cell string, an odd page buffer functions to maintain an odd bit line in a ground state (when Vss is supplied). In the second exemplary embodiment of this disclosure, during the verification operation of the even cell string, the odd page buffer is also coupled to an even bit line so that the even bit line can be precharged by two page buffers on opposite sides of the even bit line (that is, a page buffer for the read operation or the program operation of the even cell string and a page buffer for the read operation or the program operation of the odd cell string).

Figure 1:
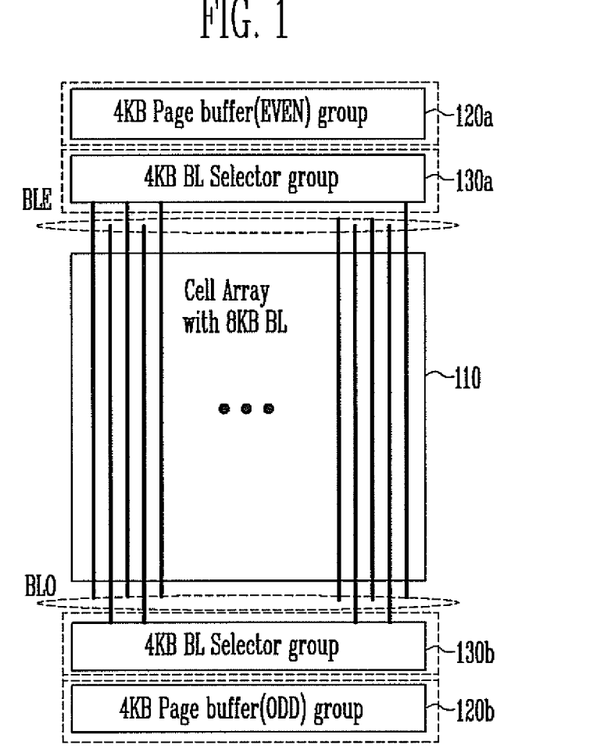
FIG. 1 is a block diagram showing the connection relationship between the page buffers and the bit lines of a semiconductor memory device according to a first exemplary embodiment of this disclosure.

FIG. 1 is a block diagram showing the connection relationship between the page buffers and the bit lines of a semiconductor memory device according to the first exemplary embodiment of this disclosure.

The semiconductor memory device using the ABL scheme employing the voltage sensing scheme is described with reference to FIG. 1.

Referring to FIG. 1, the semiconductor memory device according to the first exemplary embodiment may include a memory cell array 110 having a page size of, for example, 8 kB. Page buffer groups 120a and 120b, each having a page buffer of 4 kB, are coupled to both ends of a bit line having 8 kB. The page buffer groups 120a and 120b are coupled to the bit lines BLE and BLO through respective BL selector groups 130a and 130b each having 4 kB. The number of BL selectors included in the BL selector groups 130a and 130b is the same as the number of page buffers. The page buffers coupled to both ends of the bit line perform a program operation and a verification operation for memory cells included in an even cell string coupled to an even bit line BLE and memory cells included in an odd cell string coupled to an odd bit line BLO, respectively.

Figure 2:
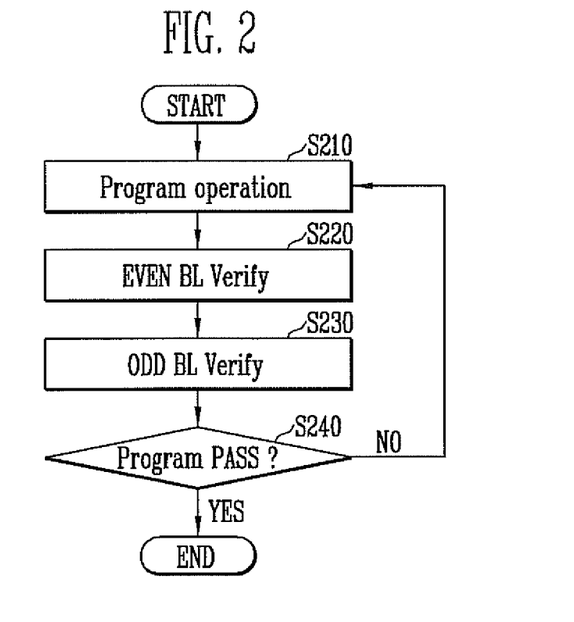
FIG. 2 is a flowchart illustrating a method of programming a semiconductor memory device according to an exemplary embodiment of this disclosure.

FIG. 2 is a flowchart illustrating a method of programming a semiconductor memory device according to an exemplary embodiment of this disclosure.

Referring to FIG. 2, external data is inputted to page buffers on both ends of the bit line. Next, a program voltage is supplied to a word line in order to program the inputted data into desired memory cells at step S210. At this time, the voltage of the bit line is set according to the inputted data. The memory cells are programmed or program-inhibited according to the set voltage of the bit line. The voltages of the even bit line and the odd bit line are set at the same time. The program operation for the even cell string and the odd cell string is performed at once by supplying one program voltage.

Next, a verification operation is performed in order to check whether the memory cells included in the even and odd cell strings coupled to the even bit line and the odd bit line have been programmed.

In this case, in the ABL scheme employing the voltage sensing scheme according to an exemplary embodiment of this disclosure, the even bit line is selected and the verification operation for the even bit line is performed at step S220. The odd bit line is then selected and the verification operation for the odd bit line is performed at step S230. The reason why the even bit line and the odd bit line are sequentially selected is described below. In the voltage sensing scheme, a shift in the voltage of the bit line is occurs as a result of the verification operation. This makes it difficult to perform an accurate sense operation due to the coupling of the even bit line and the odd bit line. For this reason, when the verification operation for the even cell string is performed, the odd bit line is grounded (i.e., a ground voltage Vss is supplied) so that the bit line coupling is reduced.

It is then checked whether all memory cells included in pages to be programmed have been fully programmed at step S240. If, as a result of the check, the memory cells have been fully programmed, the program process is finished. If, as a result of the check, the memory cells have not been fully programmed, the program operation is performed again by supplying the program voltage to the word line (i.e., step S210 is performed again). The program operation at step S210, the even bit line verification operation at step S220, and the odd bit line verification operation at step S230 may be repeated unit the memory cells have been fully programmed.

As described above, in the method of operating the semiconductor memory device according to the ABL scheme employing the voltage sensing scheme, at least the one program operation and two verification operations are performed.

Figure 3:
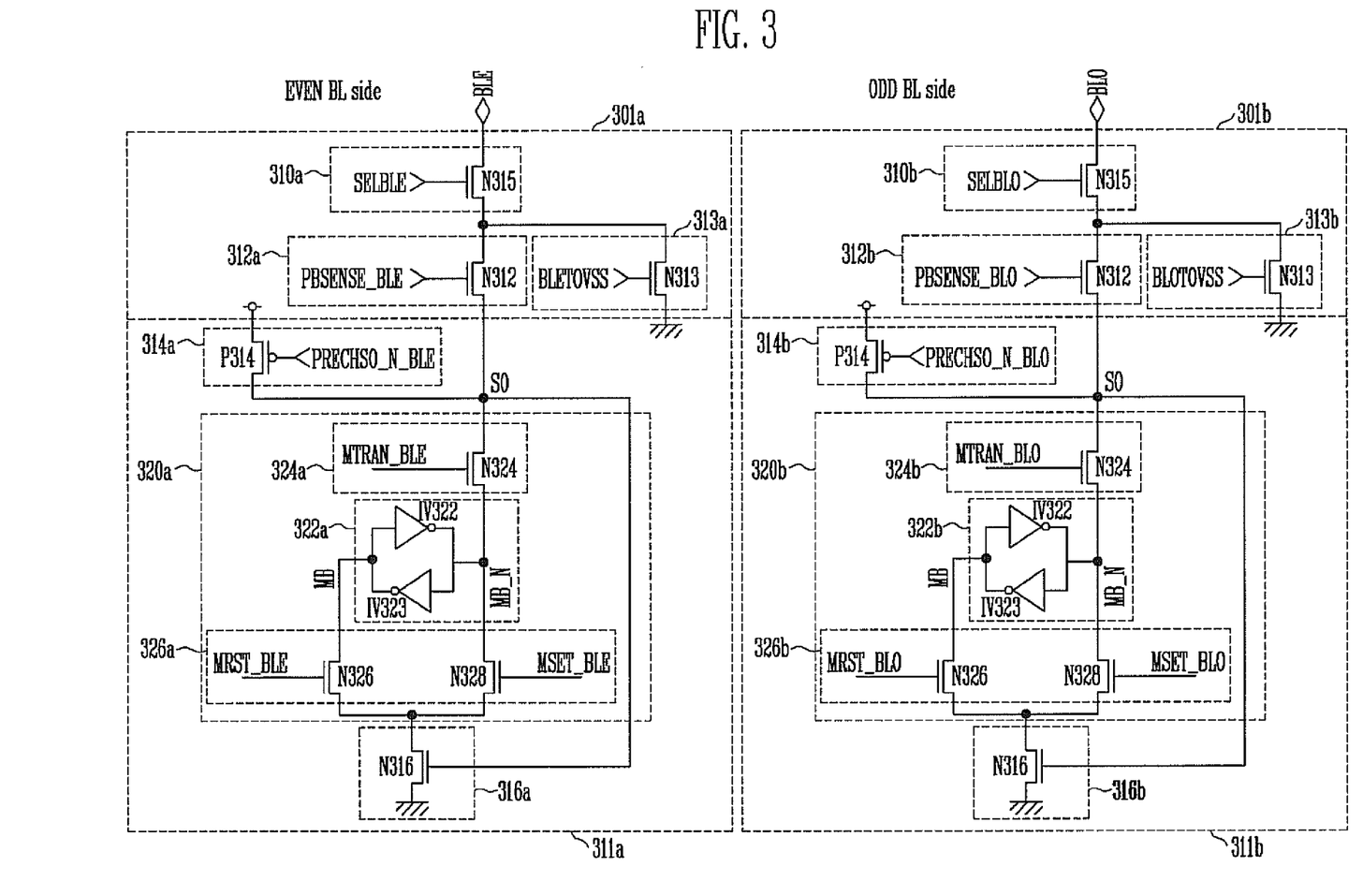
FIG. 3 is a circuit diagram of the semiconductor memory device according to a first exemplary embodiment of this disclosure.

FIG. 3 is a circuit diagram of the semiconductor memory device according to a first exemplary embodiment of this disclosure.

Referring to FIG. 3, the semiconductor memory device according to the first exemplary embodiment includes an even page buffer 311a, an odd page buffer 311b, a first BL selector 301a, and a second BL selector 301b.

The first BL selector 301a includes an even BL selection unit 310a, an even BL sense unit 312a, and an even BL discharge unit 313a. The second BL selector 301b includes an odd BL selection unit 310b, an odd BL sense unit 312b, and an odd BL discharge unit 313b.

The even page buffer 311a and the odd page buffer 311b include respective sense node precharge units 314a and 314b, respective sense node sense units 316a and 316b, and respective registers 320a and 320b.

The page buffers of the semiconductor memory device according to the first exemplary embodiment may be divided into the even page buffer 311a coupled to an even bit line BLE and the odd page buffer 311b coupled to an odd bit line BLO.

The even page buffer 311a and the odd page buffer 311b have the similar constructions, but receive different signals. Accordingly, only the even page buffer 311a is described in further detail below.

The even BL selection unit 310a may include an NMOS transistor N315 for coupling the even bit line BLE and a sense node SO in response to an even BL selection signal SELBLE.

The even BL sense unit 312a is turned on in response to an even BL sense signal PBSENSE_BLE. The even BL sense unit 312a may include an NMOS transistor N312 coupled between the even BL selection unit 310a and the sense node SO. The even BL sense unit 312a supplies a sense voltage in verification and read operations so that states of specific memory cells can be transferred to the sense node SO.

The even BL discharge unit 313a is turned on in response to an even BL discharge signal BLETOVSS. The even BL discharge unit 313a may include an NMOS transistor N313 coupled in parallel to the even BL sense unit 312a between the even BL selection unit 310a and the sense node SO. The even BL discharge unit 313a discharges the voltage of the bit line BLE to a low level in verification and read operations.

The sense node precharge unit 314a supplies a high level voltage to the sense node SO in response to a precharge signal PRECHSO_BLE. To this end, the sense node precharge unit 314a may include a PMOS transistor P314 coupled between a power supply terminal and the sense node SO. Accordingly, the sense node precharge unit 314a supplies a power supply voltage of a high level to the sense node SO in response to the precharge signal PRECHSO_BLE of a low level.

The sense node sense unit 316a supplies a ground voltage to the register 320a according to the voltage of the sense node SO. To this end, the sense node sense unit 316a may include an NMOS transistor N316 coupled between the register 320a and a ground terminal. The gate of the NMOS transistor N316 is coupled to the sense node SO. Accordingly, the ground voltage is supplied to the register 320 according to the voltage of the sense node SO.

The register 320a includes a latch unit 322a for storing data, a data set/reset unit 326a for transferring the ground voltage of the sense node sense unit 316a to the latch unit 322a in response to data set/reset signals MRST_BLE and MSET_BLE, and a data transfer unit 324a for transferring the data of a first node MB_N of the latch unit 322a to the sense node SO.

The latch unit 322a includes a first inverter IV322 and a second inverter IV323, wherein each of the input terminals of the inverters IV322 and IV323 is coupled to the output terminal of the other inverter. The node of the output terminal of the first inverter IV322 and the input terminal of the second inverter IV323 is called the first node MB_N, and the node of the input terminal of the first inverter IV322 and the output terminal of the second inverter IV323 is called a second node MB. Accordingly, data having opposite levels is maintained in the first node MB_N and the second node MB.

The data set/reset unit 326a may include an NMOS transistor N328 and an NMOS transistor N326. The NMOS transistor N328 supplies the ground voltage, received from the sense node sense unit 316a, to the first node MB_N in response to a first data set signal MSET_BLE. The NMOS transistor N326 supplies the ground voltage, received from the sense node sense unit 316a, to the second node MB in response to a second data reset signal MRST_BLE.

The data transfer unit 324a may include an NMOS transistor N324 for transferring the data of the first node MB_N of the latch unit 322a to the sense node SO in response to a data transfer signal MTRAN_BLE. Accordingly, the data of the first node MB_N can be transferred to the sense node SO in response to the data transfer signal MTRAN_BLE.

In the semiconductor memory device according to the first exemplary embodiment, during the bit line precharge section of a verification operation for an even cell string, the even bit line BLE is precharged by supplying the precharge signal PRECHSO_N_BLE of a low level to the sense node precharge unit 314a so that the PMOS transistor P314 is turned on. Meanwhile, the odd bit line BLO is discharged by supplying a BL discharge signal BLOTOVSS of a high level to the odd BL discharge unit 313b so that an NMOS transistor N313 of the odd BL discharge unit 313b is turned on.

A program verification operation of the semiconductor memory device having the above construction is described below.

Figure 4:
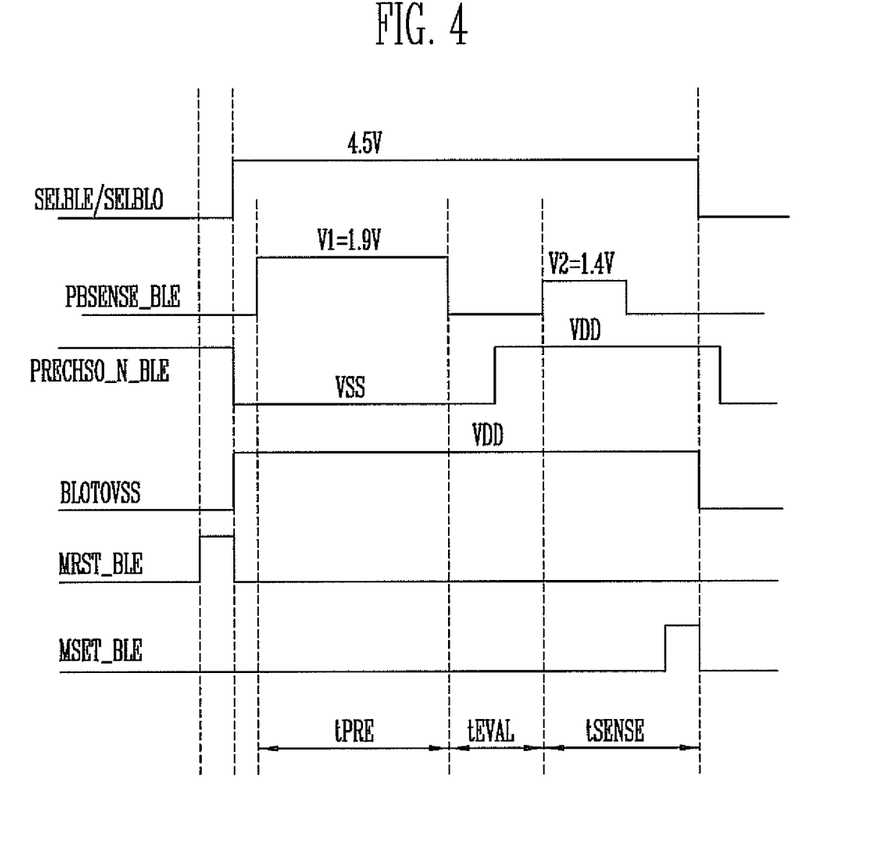
FIG. 4 is a timing diagram illustrating a method of operating the semiconductor memory device according to the first exemplary embodiment of this disclosure.

FIG. 4 is a timing diagram illustrating a method of operating the semiconductor memory device according to the first exemplary embodiment of this disclosure.

An example in which the program verification operation for an even cell string is performed is described below with reference to FIG. 4.

As shown in FIG. 4, the program verification operation may be classified into three sections.

The three sections include a bit line precharge section tPRE in which the voltage of the even bit line BLE is raised to a specific level or higher so that the voltage can be detected, a bit line evaluation section tEVAL in which the voltage of the even bit line BLE is maintained or dropped according to current flowing through the even cell string, and a bit line sense section tSENSE in which it is determined whether particular memory cells have been programmed by detecting the degree of the voltage of the bit line BLE.

If the particular memory cells have been programmed, that is, the threshold voltages of the particular memory cells are higher than a verification voltage, the particular memory cells are not turned on. Thus, a current path is not formed in the even cell string including the particular memory cells, and the voltage of the even bit line BLE maintains a high level.

However, if the particular memory cells have not been programmed, that is, the threshold voltages of the particular memory cells are lower than the verification voltage, the particular memory cells are turned on. Accordingly, a current path is formed in the even cell string including the particular memory cells, and thus, the voltage of the even bit line BLE precharged to a high level drops to a low level. As described above, the voltage of the even bit line BLE shifts according to whether the memory cells have been programmed. The shifting voltage is supplied to the sense node SO and stored in the register 320a of the even page buffer 311a.

As described above, in the method of performing the program verification operation of the semiconductor memory device according to the first exemplary embodiment, during the time for which the even bit line is precharged in order to perform the program verification operation for the even cell string, the voltage of the odd bit line BLO is maintained in a low level. The opposite is true in the program verification operation for the odd cell string.

Meanwhile, in the case of multipolar memory, the time taken to perform a verification operation is increased because verification levels are increased according to a geometric progression. If two verification operations (that is, the verification operation for the even cell string and the verification operation for the odd cell string) are performed as in the first exemplary embodiment, the time taken to perform the verification operation is further increased, and therefore, the writing performance may be degraded.

A second exemplary embodiment of this disclosure which is capable of reducing the time that it takes to perform the verification operation is described below.

Figure 5:
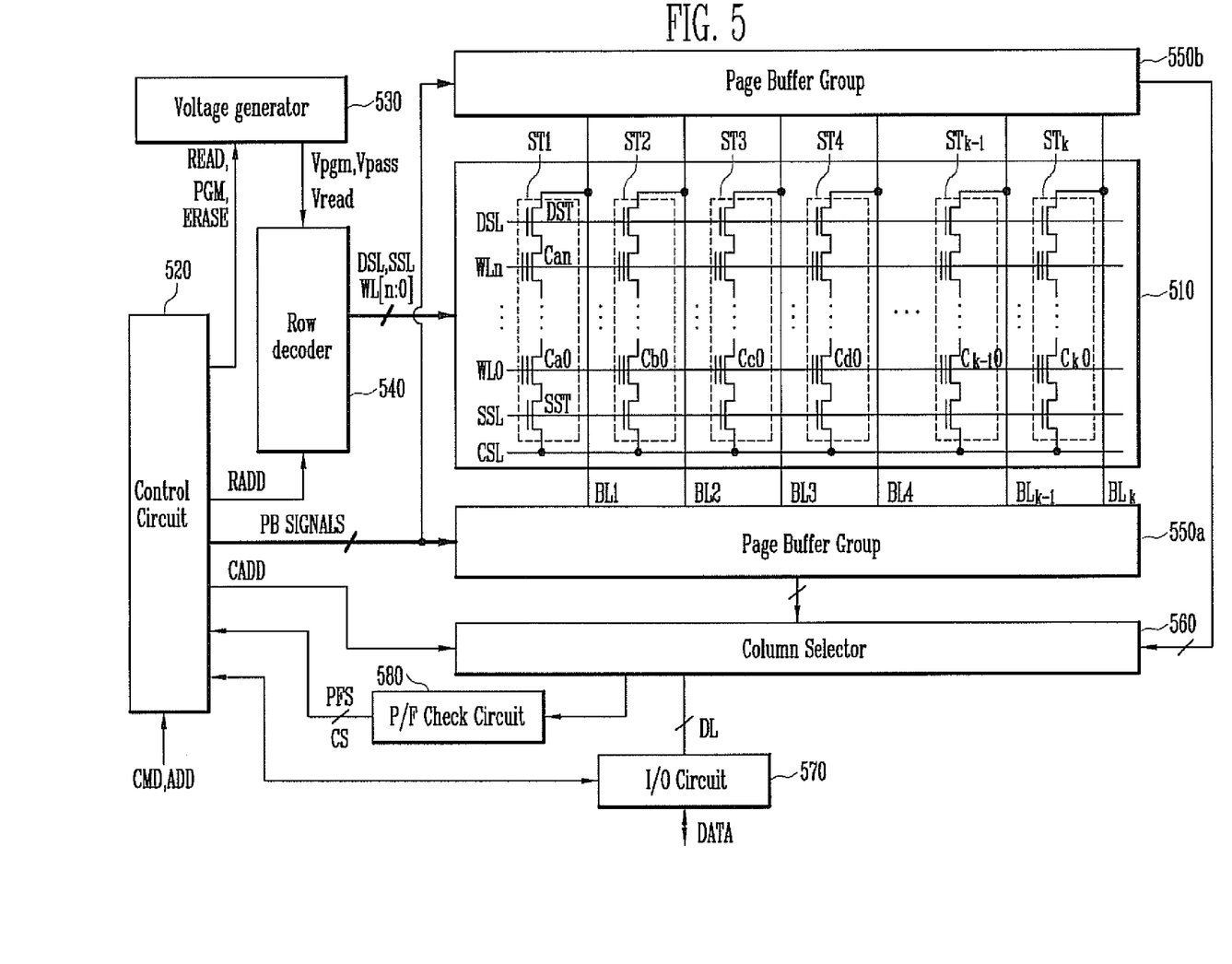
FIG. 5 is a block diagram showing the construction of a semiconductor memory device according to a second exemplary embodiment of this disclosure.

FIG. 5 is a block diagram showing the construction of a semiconductor memory device according to a second exemplary embodiment of this disclosure.

Referring to FIG. 5, the semiconductor memory device according to the second exemplary embodiment includes a memory cell array 510, an operation circuit group (530, 540, 550a, 550b, 560, 570, and 580) configured to perform the program operation or the read operation of memory cells included in the memory cell array 510, and a control circuit 520 configured to control the operation circuit group (530, 540, 550a, 550b, 560, 570, and 580) in order to precharge bit lines using all page buffers coupled to even bit lines and odd bit lines in a program verification operation.

In the case of a NAND flash memory device, the operation circuit group includes a voltage generator 530, a row decoder 540, page buffer groups 550a and 550b, a column selector 560, an I/O circuit 570, and a Pass/Fail (P/F) check circuit 580.

The memory cell array 510 includes a plurality of memory blocks. FIG. 5 shows only one of the memory blocks as an example. The memory block includes a plurality of strings ST1 to STk. Each (for example, ST1) of the strings includes a source selection transistor SST coupled to a common source line CSL, a plurality of memory cells Ca0 to Can, and a drain select transistor DST coupled to a bit line BL1. The gate of the source select transistor SST is coupled to a source select line SSL. The gates of the memory cells Ca0 to Can are coupled to respective word lines WL0 to WLn. The gate of the drain select transistor DST is coupled to a drain select line DSL. The strings ST1 to STk are coupled to the respective bit lines BL1 to BLk at one end and are commonly coupled to the common source line CSL at the other end.

In the NAND flash memory device, the memory blocks may be classified on a physical-page or logical-page basis. The page (e.g., an even page or an odd page) is the basic unit of a program operation or a read operation. That is, the program operation or read operation is performed on one page at a time.

The control circuit 520 internally generates a program operation signal PGM, a read operation signal READ, or an erase operation signal ERASE in response to a command signal CMD and also generates control signals PB SIGNALS for controlling the page buffers (not shown) of the page buffer groups 550a and 550b according to a type of operation to be performed. Furthermore, the control circuit 520 internally generates a row address signal RADD and a column address signal CADD in response to an address signal ADD. The control circuit 520 checks whether the threshold voltages of memory cells have risen to at least a target voltage based on a check signal PFS generated by the P/F check circuit 580 in a program verification operation and determines whether to perform a program operation again or to terminate the program operation according to the result of the check.

The voltage supply circuit (530, 540) supplies the drain select line DSL, the word lines WL0 to WLn, and the source select line SSL of the memory block with operating voltages for the program operation, the erase operation, and the read operation of the memory cells in response to the signals READ, PGM, ERASE, and RADD of the control circuit 520. The voltage supply circuit includes the voltage generator 530 and the row decoder 540.

The voltage generator 530 outputs the operating voltages (e.g., Vpgm, Vpass, Vread, and Vverify) for programming, reading, and erasing the memory cells to global lines in response to the signals PGM, READ, and ERASE.

The row decoder 540 transfers the operating voltages of the voltage generator 530 to the strings ST1 to STk in response to the row address signals RADD of the control circuit 520. That is, the operating voltages are supplied to the local lines DSL, WL[n:0], and SSL of the memory block.

The page buffer groups 550a and 550b include the page buffers (not shown) coupled to the respective bit lines BL1 to BLk. The page buffer groups 550a and 550b supply the bit lines BL1 to BLk with respective voltages necessary to store data in the memory cells Ca0 to Ck0 in response to the control signals PB SIGNALS. More particularly, in the program operation, the erase operation, or the read operation of the memory cells Ca0 to Ck0, the page buffer groups 550a and 550b precharge the bit lines BL1 to BLk or store data corresponding to the threshold voltages of the memory cells Ca0 to Ck0 which are detected according to a shift in the voltages of the bit lines BL1 to BLk. That is, the page buffer groups 550a and 550b control the voltages of the bit lines BL1 to BLk based on data stored in the memory cells Ca0 to Ck0 and detect data stored in the memory cells Ca0 to Ck0. In particular, in exemplary embodiments of this disclosure, the number of page buffers included in the page buffer group is identical to the number of bit lines. Accordingly, each of the page buffers is coupled to an even bit line or an odd bit line.

The column selector 560 selects the page buffers of the page buffer groups 550a and 550b in response to the column address signal CADD of the control circuit 520 and outputs data stored in the selected page buffers.

The I/O circuit 570 transfers external data DATA to the column selector 560 under the control of the control circuit 520 during a program operation so that the data is inputted to the page buffer groups 550a and 550b. When the column selector 560 sequentially transfers the data to the page buffers of the page buffer groups 550a and 550b, the page buffers store the received data in their latches. Furthermore, when a read operation is performed, the I/O circuit 570 externally outputs data DATA received from the page buffers of the page buffer groups 550a and 550b via the column selector 560.

The P/F check circuit 580 checks whether an error cell having a threshold voltage lower than a target voltage exists in programmed memory cells during a program verification operation subsequent to a program operation, and outputs the result of the check as a check signal PFS. Furthermore, the P/F check circuit 580 counts the number of error cells and outputs the result of the count as a count signal CS.

The control circuit 520 controls a program voltage supplied to a word line in the program operation of memory cells coupled to the word line and also controls the voltage generator 530 so that it selectively supplies verification voltages Vvefify to the word line in a program verification operation. In some embodiments, the control circuit 520 may control the voltage generator 530 in response to the check signal PFS of the P/F check circuit 580.

Figure 6:
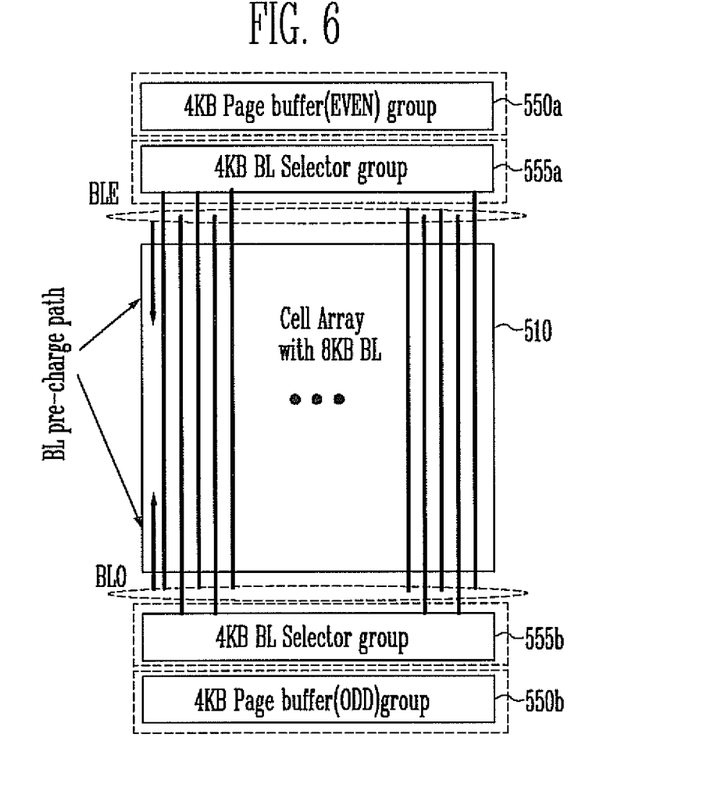
FIG. 6 is a block diagram showing the connection relationship between the page buffers and the bit lines of the semiconductor memory device of FIG. 5.

FIG. 6 is a block diagram showing the connection relationship between the page buffers and the bit lines of the semiconductor memory device of FIG. 5.

The semiconductor memory device according to the second exemplary embodiment may include the memory cell array 510 having a page size of, for example, 8 kB. The page buffer groups 550a and 550b each include 4 kB of page buffers and are arranged on opposite ends of 8 kB of bit lines. Further, the page buffer groups 550a and 550b are coupled to the 8 kb bit lines. That is, one page buffer is coupled to two bit lines (that is, an even bit line and an odd bit line).

The page buffer groups 550a and 550b are coupled to the bit lines through BL selector groups 555a and 555b. The number of bit line selectors included in the BL selector groups 555a and 555b is identical with the number of page buffers. A 4 kB number of the page buffers coupled to both ends of the bit lines perform a program operation and a verification operation for memory cells included in cell strings coupled to even bit lines and odd bit lines, respectively.

In the first exemplary embodiment of this disclosure, in a verification operation, the bit lines coupled to only the page buffers on one side, from among the page buffers coupled to both ends of the bit lines, are precharged, and the bit lines coupled to the page buffers on the other side from among them are fixed to a low level. In the second exemplary embodiment of this disclosure, the bit lines coupled to all the page buffers on both ends are precharged in order to reduce the time taken to precharge the bit lines. In other words, the time taken to precharge the bit lines can be reduced because the bit lines are precharged on both sides of the bit lines.

Figure 7:
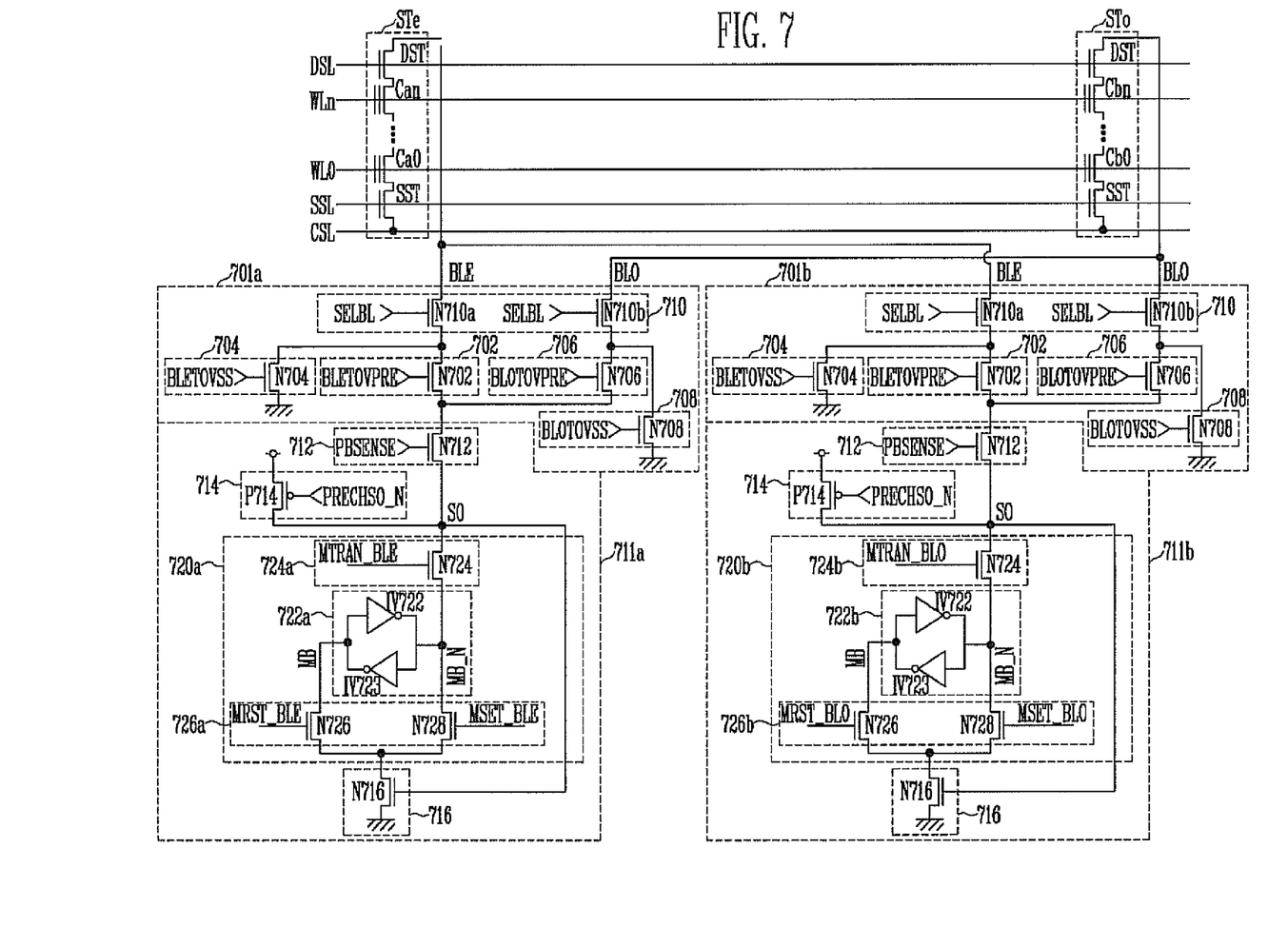
FIG. 7 is a circuit diagram of the semiconductor memory device of FIG. 5.

FIG. 7 is a circuit diagram of the semiconductor memory device of FIG. 5. FIG. 7 only illustrates two page buffers for convenience. Accordingly, only the two page buffers, which are each coupled to two cell strings through two bit lines, are described below.

Referring to FIG. 7, the semiconductor memory device according to the second exemplary embodiment includes a memory cell array (not shown) configured to include an even cell string STe coupled to an even bit line BLE and an odd cell string STo coupled to an odd bit line BLO, an even page buffer 711a coupled to the even memory cells of the memory cell array through the even bit line BLE, an odd page buffer 711b coupled to the odd memory cells of the memory cell array through the odd bit line BLO, a first BL selector 701a, and a second BL selector 701b.

The first BL selector 701a couples the even bit line BLE and the even page buffer 711a in order to store data in the even memory cells or read data stored in the even memory cells, and also couples the even page buffer 711a to the odd bit line BLO so that the even page buffer 711a can precharge the odd bit line BLO in the precharge operation of the odd bit lines BLO.

The second BL selector 701b couples the odd bit line BLO and the odd page buffer 711b in order to store data in the odd memory cells or read data stored in the odd memory cells, and also couples the odd page buffer 711b to the even bit line BLE so that the odd page buffer 711b can precharge the even bit lines BLE in the precharge operation of the even bit lines BLE.

Each of the first and second BL selectors 701a and 701b includes an even bit line precharge unit 702, an even BL discharge unit 704, an odd bit line precharge unit 706, an odd BL discharge unit 708, and a BL selection unit 710.

The even page buffer 711a and the odd page buffer 711b include respective BL sense units 712, respective sense node precharge units 714, respective sense node sense units 716, and respective registers 720a and 720b.

The page buffers of the semiconductor memory device according to the second exemplary embodiment may be divided into the even page buffers 711a on the even bit line side and the odd page buffers 711b on the odd bit line side.

The page buffer on the even bit line side refers to a page buffer for performing the data input operation or the data output operation (that is, a read operation or a program operation) for memory cells included in the cell string coupled to the even bit line. The page buffer on the odd bit line side refers to a page buffer for performing the data input operation or the data output operation (that is, a read operation or a program operation) for memory cells included in the cell string coupled to the odd bit line. The reason why the terms are defined as described above in the second exemplary embodiment is because each page buffer is coupled to an even bit line and an odd bit line. Accordingly, although each page buffer is connected to both an even bit line and an odd bit line, the page buffers may be categorized as either an even page buffer or an odd page buffer.

The page buffer on the even bit line side and the page buffer on the odd bit line side have similar circuit constructions, but receive different signals. More particularly, the same signal is supplied to circuits used to precharge the bit line, but different signals are supplied to circuits used to sense the bit line. Accordingly, only the even page buffer 711a (that is, the page buffer on the even bit line side) is described below as an example.

The BL selection unit 710 may include an NMOS transistor N710a for coupling the even bit line BLE and a sense node SO in response to a BL selection signal SELBL and an NMOS transistor N710b for coupling the odd bit line BLO and the sense node SO in response to the BL selection signal SELBL.

The even bit line precharge unit 702 may include an NMOS transistor N702 turned on in response an even bit line precharge signal BLETOVPRE and coupled between the BL selection unit 710 and the sense node SO.

The odd bit line precharge unit 706 may include an NMOS transistor N706 turned on in response to an odd bit line precharge signal BLOTOVPRE and coupled to the even bit line precharge unit 702 between the BL selection unit 710 and the sense node SO.

The even bit line precharge unit 702 and the odd bit line precharge unit 706 precharge the even bit line BLE and the odd bit line BLO, respectively, when a precharge operation is performed.

The even BL discharge unit 704 may include an NMOS transistor N704 turned on in response to an even BL discharge signal BLETOVSS and coupled in parallel to the even bit line precharge unit 702 between the BL selection unit 710 and the sense node SO.

The odd BL discharge unit 708 may include an NMOS transistor N708 turned on in response to an odd BL discharge signal BLOTOVSS and coupled in parallel to the odd bit line precharge unit 706 between the BL selection unit 710 and the sense node SO.

The even BL discharge unit 704 and the odd BL discharge unit 708 discharge the voltages of the even bit fine BLE and the odd bit line BLO to a low level when verification and read operations are performed.

The BL sense unit 712 may include an NMOS transistor N712 turned on in response to a BL sense signal PBSENSE and coupled between the even and odd bit line precharge units 702 and 706 and the sense node SO. The BL sense unit 712 supplies a sense voltage in verification and read operations so that the states of memory cells can be transferred to the sense node SO.

The sense node precharge unit 714 supplies a high level voltage to the sense node SO in response to a precharge signal PRECHSO_N. To this end, the sense node precharge unit 714 may include a PMOS transistor P714 coupled between a power supply terminal and the sense node SO. Accordingly, power supply voltage of a high level is supplied to the sense node SO in response to the precharge signal PRECHSO_N of a low level.

The sense node sense unit 716 and the register 720a have the same construction as that of the semiconductor memory device shown in FIG. 3, and therefore, a description thereof is omitted.

A precharge method in the program verification operation of the semiconductor memory device constructed as above is described below.

In the second exemplary embodiment, a scheme for reducing the time taken to perform one verification operation is used in order to improve a degradation of writing performance due to the execution of two verification operations in the first exemplary embodiment.

In the page buffers according to the first exemplary embodiment, the sense node SO is precharged in response to the sense node precharge signals PRECHSO_N_BLE and PRECHSO_N_BLO in the even page buffer and the odd page buffer. In the page buffers according to the second exemplary embodiment, however, the same sense node precharge signal PRECHSO_N is supplied to the even page buffer 711a and the odd page buffer 711b, and the same BL selection signal SELBL is supplied to the first BL selection unit 701a and the second BL selection unit 701b, thereby precharging the bit lines BLE and BLO. The time that it takes to precharge the bit lines in a verification operation can be reduced because the bit lines are precharged by two page buffers.

Furthermore, in the second exemplary embodiment, the voltage sensing scheme is also used. Accordingly, when a verification operation for an even cell string is performed, a sense operation may be accurately performed only when the voltage of the odd bit line BLO is fixed to a low level. To this end, in the second exemplary embodiment, the additional bit line precharge unit 702 and the additional BL discharge unit 708 are further used.

Figure 8:
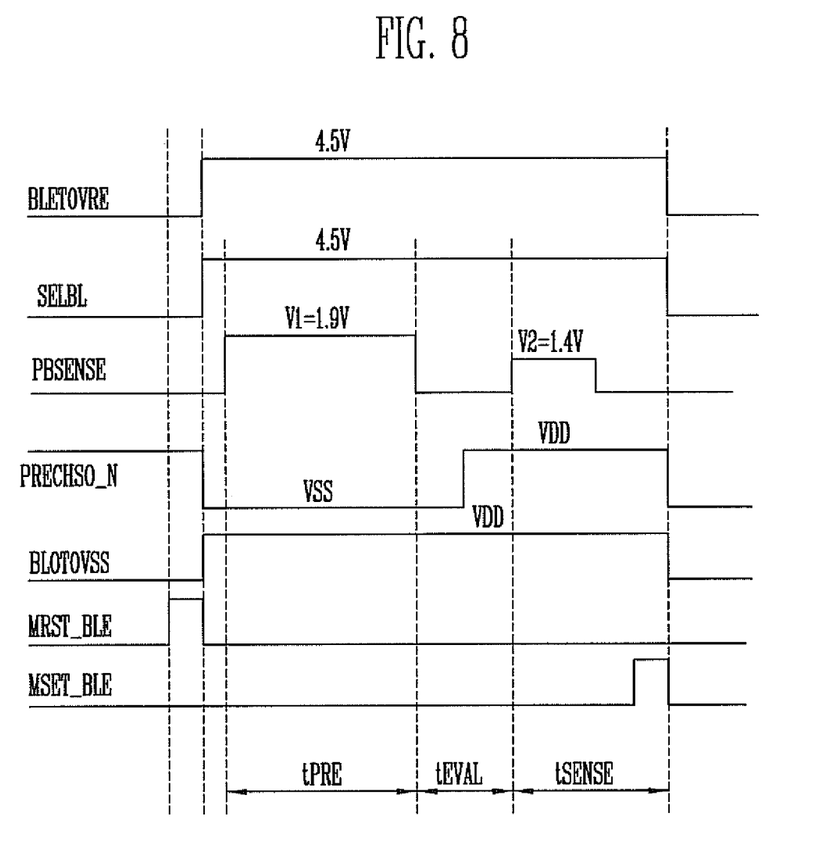
FIG. 8 is a timing diagram illustrating a method of operating the semiconductor memory device of FIG. 7.

FIG. 8 is a timing diagram illustrating a method of operating the semiconductor memory device of FIG. 7.

Referring to FIG. 8, when a verification operation for an even cell string is performed, the even bit line BLE and the odd bit line BLO are first coupled to the even page buffer 711a and the odd page buffer 711b in response to the BL selection signal SELBL of a high level. The sense node precharge signal PRECHSO_N of a low level is supplied to the even page buffer 711a and the odd page buffer 711b at the same time, thereby precharging the sense nodes SO in both the even page buffer 711a and the odd page buffer 711b.

Next, the NMOS transistor N702 of the even bit line precharge unit 702 is turned on in response to the even bit line precharge signal BLETOVPRE of a high level, and the NMOS transistor N706 of the odd bit line precharge unit 706 is turned off in response to the odd bit line precharge signal BLOTOVPRE of a low level, so that the even bit line BLE is precharged. Meanwhile, the voltage of the odd bit line is discharged to a low level in response to the odd BL discharge signal BLOTOVSS of a high level.

Next, a bit line evaluation operation is performed, and a BL sense operation (using the even data set signal MSET_BLE or the odd data reset signal MRST_BLO) is performed. Accordingly, the verification operation of the even bit line BLE is finished.

Like in the verification operation of the even bit line BLE, in a verification operation for the odd bit line BLO, the even bit line BLE and the odd bit line BLO are first coupled to the even page buffer 711a and the odd page buffer 711b in response to the BL selection signal SELBL of a high level. The sense node precharge signal PRECHSO_N of a low level is supplied to the even page buffer 711a and the odd page buffer 711b at the same time, thereby precharging the sense nodes SO of the even page buffer 711a and the odd page buffer 711b.

Next, the NMOS transistor N706 of the odd bit line precharge unit 706 is turned on in response to the odd bit line precharge signal BLOTOVPRE of a high level, and the NMOS transistor N702 of the even bit line precharge unit 702 is turned off in response to the even bit line precharge signal BLETOVPRE of a low level, so that the odd bit line BLO is precharged. Meanwhile, the voltage of the even bit line BLE is discharged to a low level in response to the even BL discharge signal BLETOVSS of a high level.

Next, a bit line evaluation operation is performed, and a BL sense operation (using the odd data set signal MSET_BLO or the even data reset signal MRST_BLE) is performed. Accordingly, the verification operation of the odd bit line BLO is finished.

In the exemplary embodiments of this disclosure, in order to reduce the degradation of writing performance due to an increased number of verification operations in the ABL scheme employing the voltage sensing scheme, in an even page buffer for the read operation or the program operation of an even cell string coupled to an even bit line and an odd page buffer for the read operation or the program operation of an odd cell string coupled to an odd bit line, the even bit line and the odd bit line are precharged at the same time. Accordingly, the time taken to precharge the bit lines can be reduced.

Consequently, the time taken to perform each verification operation can be reduced, and a degradation of writing performance can be reduced.

The exemplary embodiments of this disclosure are not implemented using only the apparatus and the method, but may be implemented using a program for realizing functions of the exemplary embodiment of this disclosure or a recording medium in which the program is stored. The implementations may be readily realized by a person having ordinary skill in the art from the description of the exemplary embodiments.

What is claimed is:

1. A semiconductor memory device, comprising:
a memory cell array configured to comprise even cell strings coupled to respective even bit lines and odd cell strings coupled to respective odd bit lines;
even page buffers coupled to even memory cells of the memory cell array through the respective even bit lines;
odd page buffers coupled to odd memory cells of the memory cell array through the respective odd bit lines;
first BL selectors, each configured to couple each of the even bit lines to the respective even page buffers in order to store data in the even memory cells or read data stored in the even memory cells, and to couple each of the even page buffers to respective odd bit lines so that the even and odd page buffers precharge the odd bit lines in a precharge operation for the odd bit lines; and
second BL selectors, each configured to couple each of the odd bit lines to the respective odd page buffers in order to store data in the odd memory cells or read data stored in the odd memory cells, and to couple each of the odd page buffers to respective even bit lines so that the even and odd page buffers precharge the even bit lines in a precharge operation for the even bit lines.

2. The semiconductor memory device of claim 1, wherein the first BL selector comprises an even bit line precharge unit for coupling the even page buffer to the even bit line and precharging the even bit line.

3. The semiconductor memory device of claim 1, wherein the first BL selector comprises an odd BL discharge unit for discharging the odd bit line when the even bit line and the even page buffer are coupled.

4. The semiconductor memory device of claim 1, wherein the first BL selector comprises an even BL discharge unit for discharging the even bit line when the odd bit line and the even page buffer are coupled in order to precharge the odd bit line.

5. The semiconductor memory device of claim 1, wherein, when the second BL selector couples the odd bit line and the odd page buffer in order to store data in the odd memory cells or read data stored in the odd memory cells, the first BL selector disconnects the even bit line and the odd bit line from the even page buffer.

6. The semiconductor memory device of claim 1, wherein the second BL selector comprises an odd bit line precharge unit for coupling the odd page buffer to the odd bit line in order to precharge the odd bit line.

7. The semiconductor memory device of claim 1, wherein the second BL selector comprises an even BL discharge unit for discharging the even bit line when the odd bit line and the odd page buffer are coupled.

8. The semiconductor memory device of claim 1, wherein the second BL selector comprises an odd BL discharge unit for discharging the odd bit line when the even bit line and the odd page buffer are coupled in order to precharge the even bit line.

9. The semiconductor memory device of claim 1, wherein, when the first BL selector couples the even bit line and the even page buffer in order to store data in the even memory cells or read data stored in the even memory cells, the second BL selector disconnects the even bit line and the odd bit line from the odd page buffer.

10. A semiconductor memory device, comprising:
a first cell string, having first memory cells, coupled to a first bit line;

a second cell string, having second memory cells, coupled to a second bit line;

a first page buffer comprising a register and a sense node precharge unit; and a first BL selector configured to couple the first bit line to the first page buffer during a precharge operation of the first bit line, and to discharge the first bit line during a precharge operation of the second bit line, wherein the first BL selector comprising:
- a first BL selection unit configured to couple the first bit line to a first node and the second bit line to a second node:
- a first BL precharge unit configured to couple the first node to the first page buffer;
- a second BL precharge unit configured to couple the second node to the first page buffer:
- a first BL discharge unit configured to couple the first node to a ground voltage terminal; and
- a second BL discharge unit configured to couple the second node to a ground voltage terminal.

11. The semiconductor memory device of claim 10, wherein the first BL selector is further configured to couple the first bit line to the first page buffer in order to store data in the first memory cells or read data stored in the first memory cells, to couple the first bit line to the first page buffer in order to precharge the first bit line, and to couple the second bit line to the first page buffer in order to precharge the second bit line.

* * * * *